United States Patent
Kobayashi et al.

(10) Patent No.: US 9,312,106 B2
(45) Date of Patent: Apr. 12, 2016

(54) DIGITAL PHASE CONTROLLER FOR TWO-PHASE OPERATION OF A PLASMA REACTOR

(71) Applicant: APPLIED MATERIALS, INC., Santa Clara, CA (US)

(72) Inventors: Satoru Kobayashi, Santa Clara, CA (US); Kartik Ramaswamy, San Jose, CA (US); Shahid Rauf, Pleasanton, CA (US); Kenneth S. Collins, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 226 days.

(21) Appl. No.: 14/174,511

(22) Filed: Feb. 6, 2014

(65) Prior Publication Data

US 2014/0265910 A1  Sep. 18, 2014

Related U.S. Application Data (60) Provisional application No. 61/778,939, filed on Mar. 13, 2013.

(51) Int. Cl.
*H05B 41/16* (2006.01)
*H01J 37/32* (2006.01)

(52) U.S. Cl.
CPC ..... *H01J 37/32183* (2013.01); *H01J 37/32091* (2013.01); *H01J 37/3299* (2013.01); *H01J 37/32174* (2013.01)

(58) Field of Classification Search
None
See application file for complete search history.

(56) References Cited

U.S. PATENT DOCUMENTS

| | | | |
|---|---|---|---|
| 5,116,482 A | 5/1992 | Setoyama et al. | |
| 5,314,603 A * | 5/1994 | Sugiyama | H01J 37/32082 156/345.28 |
| 5,573,595 A | 11/1996 | Dible | |
| 5,576,629 A * | 11/1996 | Turner | B24B 37/013 118/708 |
| 5,810,963 A | 9/1998 | Tomioka | |
| 5,824,606 A | 10/1998 | Dible et al. | |
| 5,844,369 A * | 12/1998 | Yoshizako | H05H 1/46 315/111.21 |
| 5,907,221 A | 5/1999 | Sato et al. | |
| 5,971,591 A * | 10/1999 | Vona | H01J 37/32935 219/121.54 |
| 6,214,162 B1 * | 4/2001 | Koshimizu | H01J 37/321 118/723 I |
| 6,788,736 B1 | 9/2004 | Kawama et al. | |
| 7,176,634 B2 * | 2/2007 | Kitamura | H01J 37/32082 204/298.08 |
| 7,359,177 B2 * | 4/2008 | Yang | H01J 37/32706 156/345.28 |
| 7,477,711 B2 * | 1/2009 | Kalvaitis | H01J 37/32082 375/147 |
| 8,073,646 B2 * | 12/2011 | Sato | H01J 37/32082 118/712 |
| 8,729,932 B2 * | 5/2014 | Chiesa | H03B 27/00 327/116 |
| 9,110,106 B2 * | 8/2015 | Kitano | G01R 25/00 |
| 2002/0014402 A1 * | 2/2002 | Nagamine | C23C 14/34 204/192.13 |

(Continued)

OTHER PUBLICATIONS

Official Action Dated Apr. 7, 2015 Issued in Related U.S. Appl. No. 13/632,302.

*Primary Examiner* — Douglas W Owens
*Assistant Examiner* — Srinivas Sathiraju
(74) *Attorney, Agent, or Firm* — Robert M. Wallace (57) ABSTRACT

Phase angle between opposing electrodes in a plasma reactor is controlled in accordance with a user selected phase angle. Direct digital synthesis of RF waveforms of different phases for the different electrodes is employed. The synthesis is synchronized with a reference clock. The address generator employed for direct digital synthesis is synchronized with an output clock signal that is generated in phase with the reference clock using a phase lock loop. The phase lock loop operates only during a limited initialization period.

20 Claims, 10 Drawing Sheets

(56) References Cited

U.S. PATENT DOCUMENTS

| | | | |
|---|---|---|---|
| 2002/0185227 A1* | 12/2002 | MacGearailt | H01J 37/3299 156/345.43 |
| 2003/0111180 A1* | 6/2003 | Nagahata | H01J 37/32091 156/345.47 |
| 2004/0050495 A1* | 3/2004 | Sumiya | C23C 16/5096 156/345.48 |
| 2007/0114945 A1* | 5/2007 | Mattaboni | G01N 21/73 315/111.01 |
| 2009/0256489 A1* | 10/2009 | Morales | H05B 41/3927 315/246 |
| 2010/0224321 A1* | 9/2010 | Grimbergen | H01J 37/321 156/345.24 |
| 2011/0140607 A1* | 6/2011 | Moore | A61B 18/042 315/111.21 |
| 2011/0192349 A1* | 8/2011 | Hammond, IV | C23C 16/509 118/723 E |
| 2011/0240222 A1* | 10/2011 | Sawada | H01J 37/321 156/345.28 |
| 2012/0086464 A1 | 4/2012 | Hanawa et al. | |
| 2012/0139586 A1 | 6/2012 | Dayi et al. | |
| 2012/0212135 A1 | 8/2012 | Suzuki | |
| 2013/0284369 A1* | 10/2013 | Kobayashi | H01J 37/32091 156/345.26 |
| 2013/0284370 A1 | 10/2013 | Collins et al. | |

* cited by examiner

| Address | Voltage |
|---------|---------|
| 1 | 1/1 |
| 2 | 1/2 |
| 3 | 1/3 |
| 4 | 1/4 |
| 5 | 1/5 |
| 6 | 1/6 |
| 7 | 1/7 |
| ... | ... |

# DIGITAL PHASE CONTROLLER FOR TWO-PHASE OPERATION OF A PLASMA REACTOR

CROSS-REFERENCE TO RELATED APPLICATIONS

This application claims benefit of U.S. Provisional Application Ser. No. 61/778,939, filed Mar. 13, 2013 entitled DIGITAL PHASE CONTROLLER FOR TWO-PHASE OPERATION OF A PLASMA REACTOR, by Satoru Kobayashi, et al.

BACKGROUND

1. Technical Field

The disclosure pertains to a plasma reactor for processing a workpiece such as a semiconductor wafer using RF power of different phases applied to different RF power applicators.

2. Background Discussion

Plasma processing of a workpiece in the fabrication of integrated circuits, plasma displays, solar panels or the like requires uniform or controlled treatment of each workpiece across its surface. For example, in plasma processing of semiconductor wafers, feature sizes are on the order of nanometers, and uniformity and control of plasma ion distribution density across the workpiece surface is critical. Uniformity of distribution of etch rate or deposition rate across the surface of workpiece is required, as workpiece size (e.g., semiconductor wafer diameter) is increasing, and feature sizes are decreasing. Non-uniformity in plasma processing can arise from non-uniformities or asymmetries in the reactor chamber electrical characteristics, non-uniformity in the distribution of process gases and flow rates, or non-uniformity in the application of RF power, for example. It is necessary to correct or compensate for such non-uniformities.

Plasma processing of a workpiece can be controlled by controlling the phase difference between RF power waveforms applied to different RF power applicators of a plasma reactor. The RF power applicators may be, for example, an electrode in the wafer support pedestal and a ceiling electrode overlying the pedestal. The user may select a desired phase difference for process control purposes. RF sensors at the two electrodes are used to measure the actual phase difference, and this measurement is compared to the desired phase difference to produce a phase correction command. A phase controller controlling the RF power source responds to the phase correction command to effect the desired correction.

A problem is that the phase controller is capable of effecting the desired correction only at a limited speed and with limited accuracy due to instabilities. This is particularly true where analog techniques are employed in implementing the phase controller. There is a need for a phase controller that effects the desired correction at a faster speed and that is free of instabilities.

SUMMARY

A plasma reactor for processing a workpiece in one embodiment has a pair of electrodes facing a processing zone and a pair of RF power amplifiers coupled to respective ones of the electrodes. An RF phase angle between the pair of electrodes is controlled. The reactor includes a feedback controller having a phase correction signal output that is a function of the RF phase angle and a user-defined target phase angle. A clock generator comprises: (a) a voltage controlled oscillator responsive to a control signal corresponding to a phase difference between the voltage controlled oscillator and a reference clock, and (b) an output clock derived from an output of the voltage controlled oscillator. The reactor further includes a digital synthesizer including an address generator having a pair of address outputs incremented in synchronism with the output clock. The address outputs are separated by an address difference that is a function of the phase correction signal output. The digital synthesizer further includes a pair of waveform-containing read only memories coupled to receive respective ones of the pair of address outputs, and coupled to respective ones of the top and bottom RF amplifiers.

In a further embodiment, the plasma reactor further includes a microcontroller coupled to the clock generator, the microcontroller adapted to prevent change in the control signal after a limited initialization period. In one embodiment, the microcontroller is coupled to the address generator, the microcontroller further adapted to inactivate the address generator during the limited initialization period. The feedback controller may be comprised in the microcontroller.

In one implementation, the output clock is of a frequency exceeding the reference clock by a first integer multiple, and the voltage controlled oscillator has a frequency exceeding the frequency of the output clock by a second integer multiple.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

The plasma reactor described herein can control certain process characteristics, such as radial distribution of plasma ion density, by controlling the phase difference between RF source power waveforms applied to opposing RF source power applicators above and below the surface of the workpiece being treated. In the description that follows, the opposing RF source power applicators are opposing electrodes. The RF power distribution at the surface of the workpiece affects plasma ion density, which in turn affects process rate distribution. The process may be an etch process or a deposition process, for example.

In general, RF power of the same frequency is applied to the two opposing electrodes. In one embodiment, maintaining a phase difference of 180° between the RF waveforms applied to the opposing electrodes causes the electric field lines to extend in a generally straight manner between the opposing electrodes, resulting in a center-high (edge-low) radial distribution of plasma ion density at the workpiece surface. Maintaining a phase difference of 0° between the RF waveforms applied to the opposing electrodes causes the electric field lines to extend in a radial direction from each of the opposing electrodes to the grounded side wall of the chamber enclosure, resulting in an edge-high (center-low) radial distribution of plasma ion density at the workpiece surface. In principle, the user selects any degree of center-high or edge-high radial distribution of the plasma by selecting a phase angle or phase difference of the two electrodes in the range of 0° to 180°.

Figure 1A:
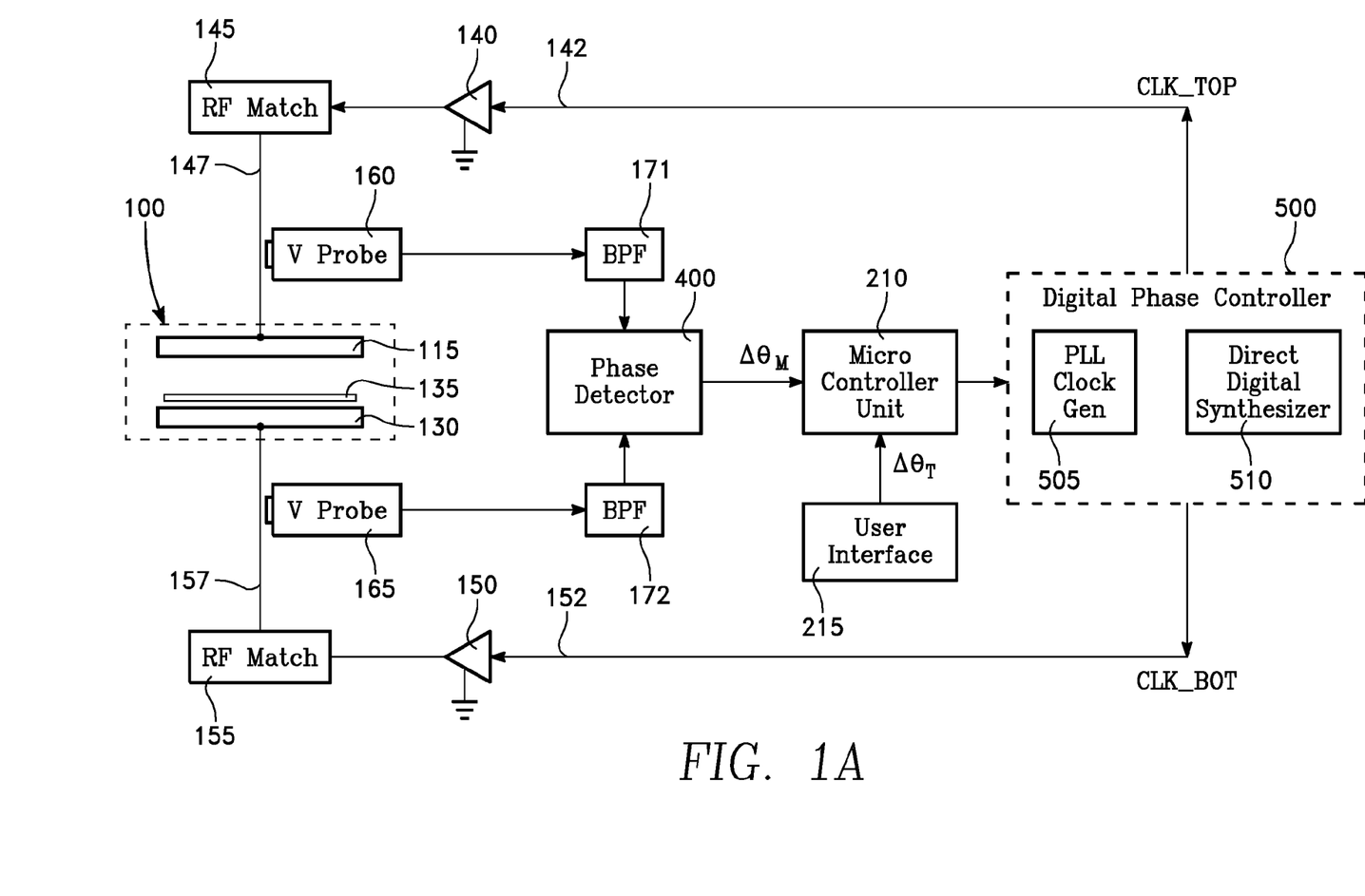
FIG. 1A is a simplified block diagram of a plasma reactor system including a digital phase controller.
Figure 1B:
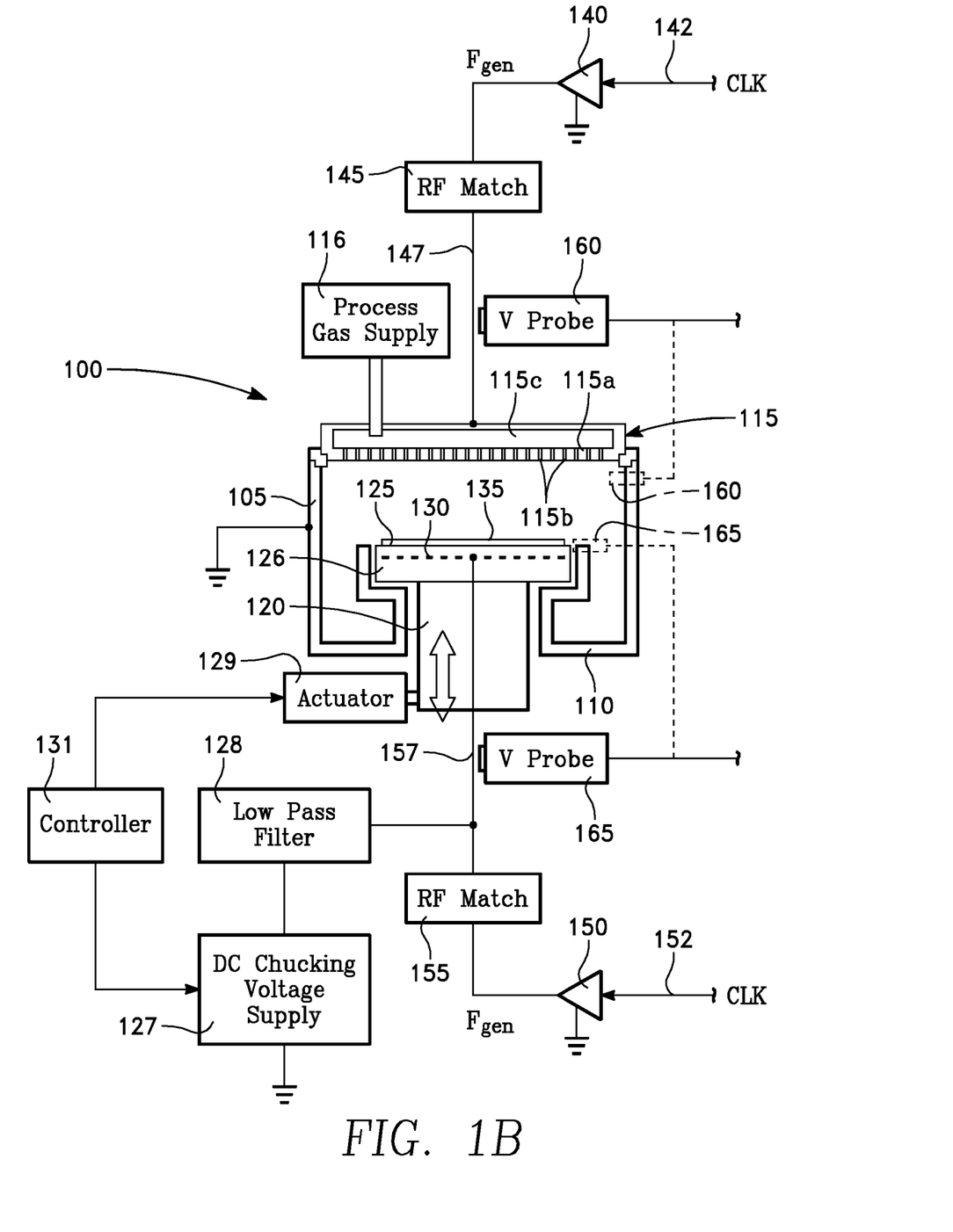
FIG. 1B is an enlarged view of a portion of FIG. 1A.

Referring to FIGS. 1A and 1B, a plasma reactor includes a vacuum chamber enclosure 100 that includes a cylindrical side wall 105, a floor 110, and a ceiling electrode 115. A pedestal 120 extends through the floor 110 and holds a workpiece support 125 including a workpiece support electrode 130 underlying a workpiece support surface at the top of the workpiece support and facing the ceiling electrode 115. A workpiece such as semiconductor wafer 135 may be held on the workpiece support surface of the workpiece support 125. Also included in the embodiment of FIGS. 1A and 1B, (but not shown in the drawings) are an exhaust port in the floor 110 and a vacuum pump coupled to the exhaust port.

As depicted in the enlarged view of FIG. 1B, the ceiling electrode 115 in one embodiment is a gas distribution plate including a bottom layer 115a having an array of gas injection orifices 115b, and a gas manifold 115c over the array of gas injection orifices 115b. A process gas supply 116 is coupled to the gas manifold 115c. The workpiece support 125 embodies an electrostatic chuck, including an insulating puck 126 in which the electrode 130 is embedded. A D.C. chucking voltage supply 127 is connected through a low pass isolation filter 128 to the electrode 130. The electrode 130 functions as an electrostatic chucking electrode as well as an electrode through which RF bias power is coupled to the plasma. The workpiece support 125 is may be raised toward the ceiling electrode 115 or depressed away from the ceiling electrode so as to controllably vary the workpiece-to-ceiling gap. For this purpose, an actuator 129 coupled to the workpiece support raises and depresses the workpiece support 125. A process controller 131 may govern the actuator 129 and the D.C. voltage supply 127.

A top RF power amplifier 140 is synchronized with the output of a clock input 142. The top RF power amplifier 140 is coupled to the ceiling electrode 115 through a top RF impedance match circuit 145 by a top coaxial feed 147. A bottom RF power amplifier 150 of the same frequency as the top RF power amplifier 140 is coupled through a bottom RF impedance match circuit 155 to the workpiece support electrode 130 by a bottom coaxial feed 157. The top and bottom RF power amplifiers 140 and 150 output the same frequency, Fgen, which may be a VHF frequency suitable for a capacitively coupled plasma source. The bottom RF power amplifier 150 is synchronized to a clock input 152.

The side wall 105 is conductive and is connected to ground. The side wall 105 functions as a third electrode to the ceiling and workpiece support electrodes 115 and 130.

A top RF sensor probe 160 is placed near or on the ceiling electrode 115. The top RF sensor probe 160 may be of the type disclosed in co-pending U.S. Pat. No. 8,513,939 B2 issued Aug. 20, 2013 by Satoru Kobayashi et al, entitled IN-SITU VHF VOLTAGE/CURRENT SENSORS FOR A PLASMA REACTOR. The RF sensor probe 160 may be an RF voltage probe or an RF sensor probe or other suitable probe. If the top RF sensor probe 160 is an RF voltage probe, then the top RF sensor probe 160 has a floating electrode in its sensor head that may be coupled to the center conductor of the top coaxial feed 147. Alternatively, for a sufficiently low frequency range (e.g., below 1 MHz) the floating electrode of the top RF sensor probe 160 may be coupled to the ceiling electrode, in which case the probe 160 may be on either side of the ceiling electrode 115 (i.e., either inside or outside of the enclosure 100), as indicated in dashed line in FIG. 1B. Placement of the RF sensor probe 160 close to the ceiling electrode 115 in this manner provides accurate measurement without distortion by the impedance match 145. Otherwise, for frequencies above 1 MHz, the measurement should be taken inside the coaxial top feed 147.

A bottom RF sensor probe 165 is placed near the workpiece support electrode 130 or is coupled to the center conductor of the bottom coaxial feed 157. The bottom RF sensor probe 165 may be of the same type as the top RF sensor probe 160. The bottom RF sensor probe 165 has a floating electrode in its sensor head that may be coupled to the center conductor of the bottom coaxial feed 157. Alternatively, for a low frequency range (e.g., below 1 MHz), the floating electrode of the bottom RF sensor probe 165 may be coupled to the workpiece support 125 or electrode 130, in which case the probe 165 may be inside the enclosure 100, as indicated in dashed line in FIG. 1B. Placement of the RF sensor probe 165 close to the workpiece support electrode 130 in this manner provides accurate measurement without distortion by the impedance match 155.

If the bottom RF sensor probe 165 is coupled to the RF feed 157 at a significant distance from the support electrode 130, then a transform processor (not illustrated) may be used to improve accuracy of the measurement. The unillustrated transform processor provides a correction of the signal from the bottom RF sensor probe 165 to compensate for differences attributable to the distance between the bottom RF sensor probe 165 and the workpiece support electrode 130.

Figure 2:
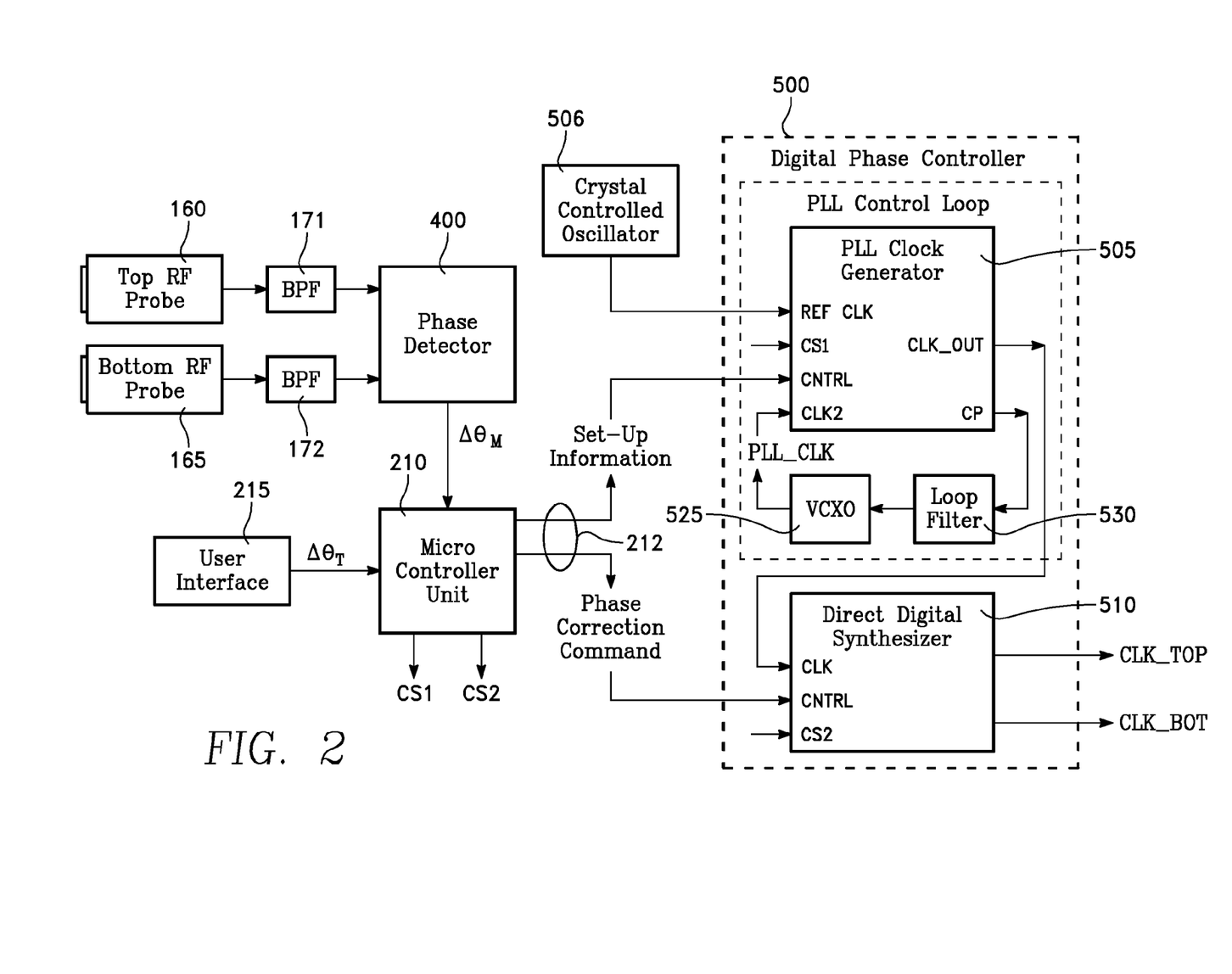
FIG. 2 is a schematic block diagram depicting a portion of the system of FIG. 1 including a digital phase controller in accordance with one embodiment.

In FIG. 2, the outputs of the probes 160 and 165 are filtered by respective band pass filters 171, 172 and then processed by a phase detector 400 to produce a signal representing a measured phase difference $\Delta\theta_M$. A feedback controller implemented in a microcontroller unit (MCU) 210 compares the measured phase difference $\Delta\theta_M$ with a user-selected (or target) phase difference $\Delta\theta_T$ received from a user interface 215, to determine a phase error or difference between $\Delta\theta_M$ and $\Delta\theta_T$. The MCU 210 computes from this error a phase correction command signal, which is applied to the digital phase controller 500. The digital phase controller 500 sends respective output clock signals, CLK_TOP and CLK_BOT, to the clock inputs 142, 152 of the top and bottom RF amplifiers 140, 150, respectively. The digital phase controller 500 adjusts the relative phase of the output clock signals CLK_TOP and CLK_BOT in accordance with the phase correction command signal from the MCU 210. This adjustment is carried out to reduce the error or difference between $\Delta\theta_M$ and $\Delta\theta_T$.

The digital phase controller 500 includes a phase lock loop (PLL) clock generator 505 and a direct digital synthesizer (DDS) 510. The DDS 510 produces the clock signals CLK_TOP and CLK_BOT for the top and bottom RF amplifiers 140, 150, in synchronism with an output clock signal from the PLL clock generator 505.

Figure 3:
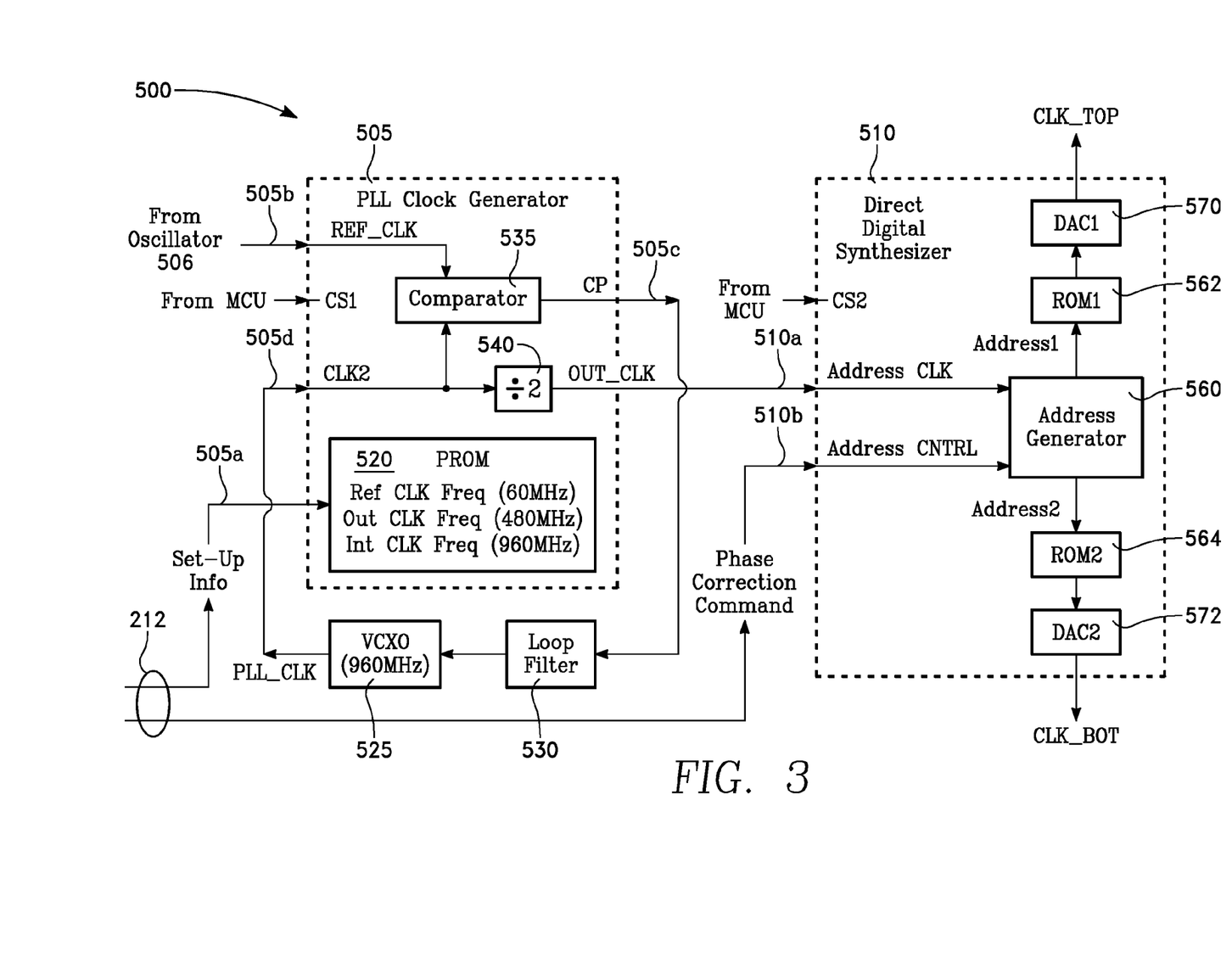
FIG. 3 is a schematic block diagram depicting the architecture of the digital phase controller of FIG. 2.

FIGS. 2 and 3 depict one embodiment of the digital phase controller 500 of FIG. 1A. As will be described below in greater detail. The following is a brief introduction to its operation: During a short initialization period, the MCU 210 enables the PLL clock generator 505 to synchronize an extremely high frequency (e.g., 960 MHz) internal PLL clock signal PLL_CLK (indicated in FIG. 3) with the phase of a reference clock signal, REF_CLK. The reference clock signal REF_CLK defines the RF frequency that is to be applied to the top and bottom electrodes 115, 130 (e.g., 60 MHz), and its source may be a crystal controlled oscillator provided at a suitable location, as will be described below. The PLL clock generator 505 produces from the PLL clock signal, PLL_CLK, an output clock signal, OUT_CLK, of an intermediate frequency (e.g., 480 MHz). The output clock signal OUT_CLK controls the DDS 510. After a period of time sufficient to guarantee completion of synchronization of PLL_CLK with REF_CKL (e.g., 1-10 microseconds), the phase of OUT_CLK is fixed, and no further adjustments of the PLL clock generator 505 are permitted. Thereafter, the DDS 510 is activated and operates in a purely digital mode without any delays or feedback control loop noise in the reference clock signal REF_CLK. Absence of such noise provides a significant advantage.

Command and information outputs of the MCU 210 are carried to the PLL clock generator 505 and to the DDS 510 on a multi-signal information channel 212. One output of the multi-signal information channel 212 is coupled to a programming input 505a of the PLL clock generator 505. Another output of the multi-signal information channel 212 is connected to a control input 510b of the DDS 510. During the initialization period, the MCU 210 enables the PLL clock generator 505 to be programmed by setting its chip select (CS1) input to 1. At the same time, the MCU 210 may disable the DDS 510 by setting its chip select input CS2 to zero. During the initialization period, the MCU 210 programs the PLL clock generator 505 with the following set-up information transmitted on the multi-signal information channel 212 to the programming input 505a of the PLL clock generator 505: the reference clock frequency (e.g., 60 MHz), the output clock frequency (e.g., 480 MHz) and the internal clock frequency (e.g., 960 MHz). As depicted in FIG. 3, these values may be written to a programmable read-only memory 520 in the PLL clock generator 505.

The synchronization of PLL_CLK with REF_CLK is performed by a PLL feedback control loop consisting of the PLL clock generator 505, the programmable voltage controlled oscillator (VCXO) 525 and the loop filter 530. This PLL feedback control loop operates as follows: The VCXO 525 produces at its output the PLL clock signal PLL_CLK (e.g., 960 MHz), which is applied to a CLK2 input 505d of the PLL clock generator 505. The reference clock REF_CLK (e.g., 60 MHz) from the crystal controlled oscillator 506 is applied to a reference clock input 505b of the PLL clock generator 505. Referring to FIG. 3, a digital comparator 535 in the PLL clock generator 505 senses a phase difference between REF_CKL and PLL_CLK and generates, from the phase difference, a VCXO correction signal at a CP output 505c of the PLL clock generator 505. The VCXO correction signal from the CP output 505c is applied through the loop filter 530 to the control input of the VCXO 525. In one embodiment, the loop filter 530 is a low pass filter having a cut-off frequency of which is determined by trade-off among locking-speed, phase-noise and spurious frequency. However, in the illustrated embodiment, the VCXO correction signal at the CP output 505c approximates a D.C. voltage.

The VCXO correction signal eventually (e.g., after 1-10 microseconds) stabilizes the VCXO output (i.e., PLL_CLK) to be in phase with REF_CLK. A divider 540 reduces the frequency (e.g., 960 MHz) of PLL_CLK to the intermediate frequency (e.g., 480 MHz) to produce OUT_CLK, which is applied to the DDS 510. While in the embodiment of FIG. 3 the divider 540 divides the frequency by a factor of 2, in other embodiments a different factor may be employed in the divider 540. Also, values for the frequencies of PLL_CLK, OUT_CLK and REF_CLK different from the values referred to above may be employed.

The initialization period ends and an active period begins when the MCU reverses the chip select signals CS1 and CS2 to deselect the address generator 560 and select the DDS 510. This prevents further changes in the PLL clock generator 505, thereby fixing the level of the CP output 505c to the VCXO 525 to its most recent value, which fixes the phase of PLL_CLK and therefore fixes the phase of OUT_CLK, and thus providing the DDS 510 with a continuous stable clock signal. Operation of the DDS 510 is thereafter not coupled to a feedback control loop, and is purely digital.

Figure 4:
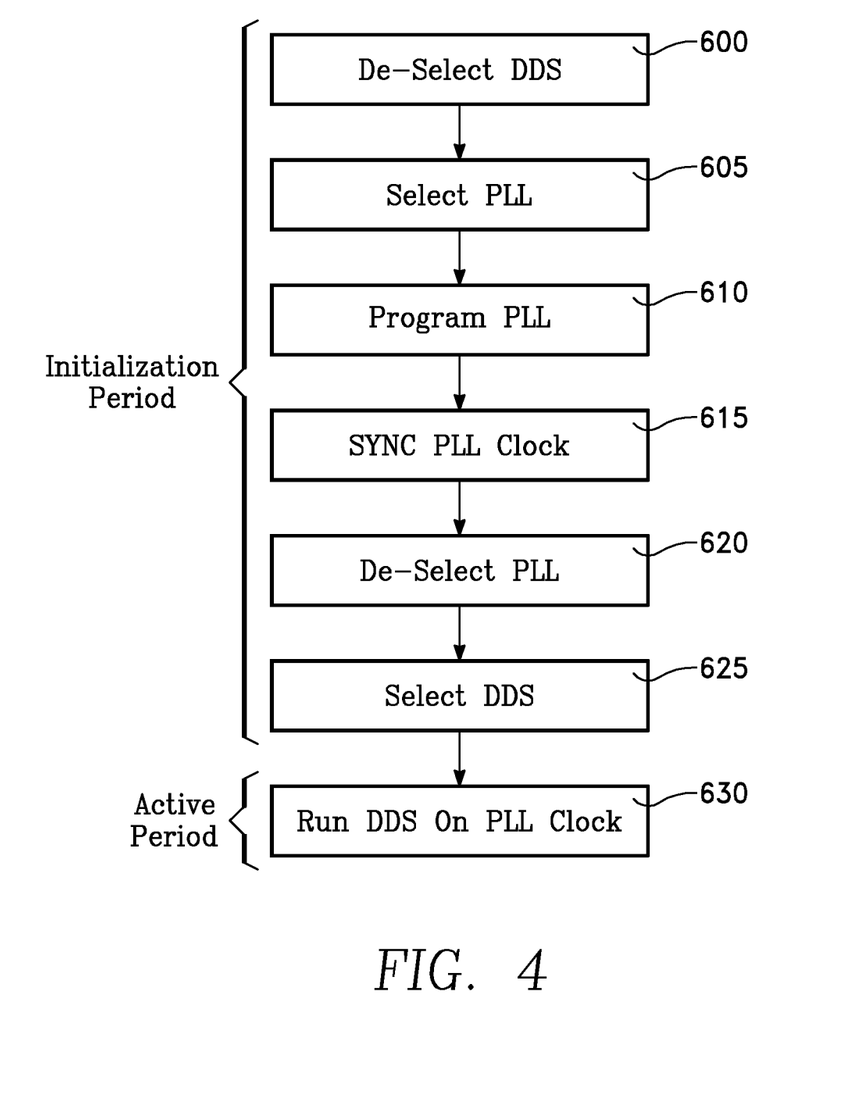
FIG. 4 is a block diagram depicting operation of the system of FIG. 2 in accordance with an embodiment.

FIG. 4 depicts the foregoing operation during the initialization period and the active period. A first step is to hold the DDS 510 inactive (block 600 of FIG. 4). In one embodiment, this performed by setting the DDS chip select signal CS2 to zero. A second step is to enable programming of the PLL clock generator 505 (block 605), which in one embodiment is performed by setting the CS1 signal to 1. In the next step (block 610), the MCU 210 programs the PLL clock generator 505 with the following information: the reference clock frequency (e.g., 60 MHz), the output clock frequency (e.g., 480 MHz) and the internal clock frequency (e.g., 960 MHz). Then, the PLL feedback control loop (the PLL clock generator 505, the loop filter 530 and the VCXO 525) synchronizes the phase of PLL_CLK with REF_CLK (block 615 of FIG. 4). After the PLL feedback control loop has stabilized (which may take a number of microseconds or milliseconds), the PLL clock generator 505 is deselected, the phase of its output, OUT_CLK, is fixed and the PLL feedback control loop stops (block 620 of FIG. 4). The DDS 510 is activated or selected (block 625 of FIG. 4), and operates in phase synchronization with OUT_CLK. Thereafter, an active period begins (block 630) in which the DDS 510 operates in a digital mode, as will now be described.

Figure 5:
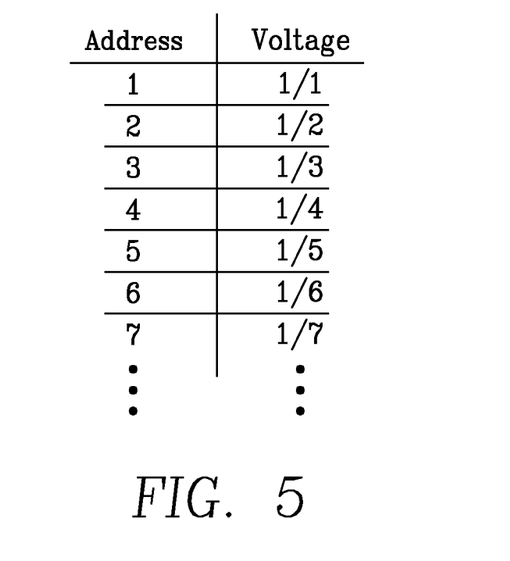
FIG. 5 depicts in tabular form the contents of a read-only memory of a direct digital synthesizer in the digital phase controller of FIG. 2.
Figure 6:
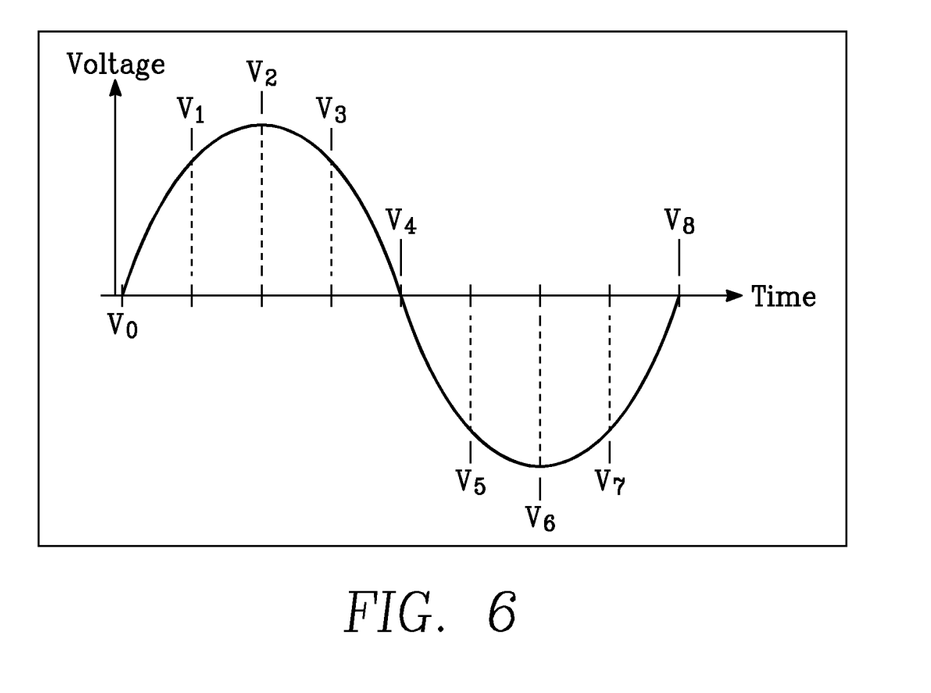
FIG. 6 is a graph depicting the relation between the memory contents of FIG. 5 and an RF waveform of the system of FIG. 1.

Referring to FIG. 3, the output clock signal OUT_CLK is applied to the clock input 510a of the DDS 510. The phase correction command signal from the MCU 210 is applied (via the multi-signal channel 212) to the control input 510b of the DDS 510. The DDS 510 includes an address generator 560 coupled to a pair of read-only memories (ROMs) 562, 564 that store samples of sine wave forms at individual memory addresses in order, in the manner depicted in tabular form in FIG. 5. FIG. 6 depicts the construction of a sine wave from values stored in memory at successive memory addresses.

The address generator applies a memory address to each ROM 562, 564. Each of the ROMs 562, 564 outputs the magnitude of the sample stored at the specified memory address. The address generator 560 increments the addresses in synchronism with OUT_CLK. Digital-to-analog converters (DACs) 570, 572 convert the digital samples streaming from the ROMs 562, 564 to appropriate voltages, corresponding to sine wave forms of the clock signals CLK_TOP and CLK_BOT of FIG. 1A. Each DAC 570, 572 may include a low pass filter (not illustrated) to smooth the output wave form. The contents of the two ROMs 562, 564 may be identical. The address generator 560 applies address bytes ADDRESS1 and ADDRESS2 to the respective ROMs 562, 564. The address generator 560 constantly increments ADDRESS1 and ADDRESS2 in synchronism with OUT_CLK applied to a clock input 510a of the DDS 510. The difference between ADDRESS1 and ADDRESS2 determines the phase difference between CLK_TOP and CLK_BOT, and is controlled by the address generator 560 in response to the phase correction signal received from the MCU 210 via the channel 212 at the control input 510b. This difference is controlled by the address generator 560 in accordance with the phase change dictated by the phase correction signal from the MCU 210. The address generator 560 converts the angle of the phase change to the address difference (ADDRESS1−ADDRESS2) by a conversion factor that is a function of the ratio between the frequency of REF_CLK and the frequency of OUT_CLK.

Figure 7:
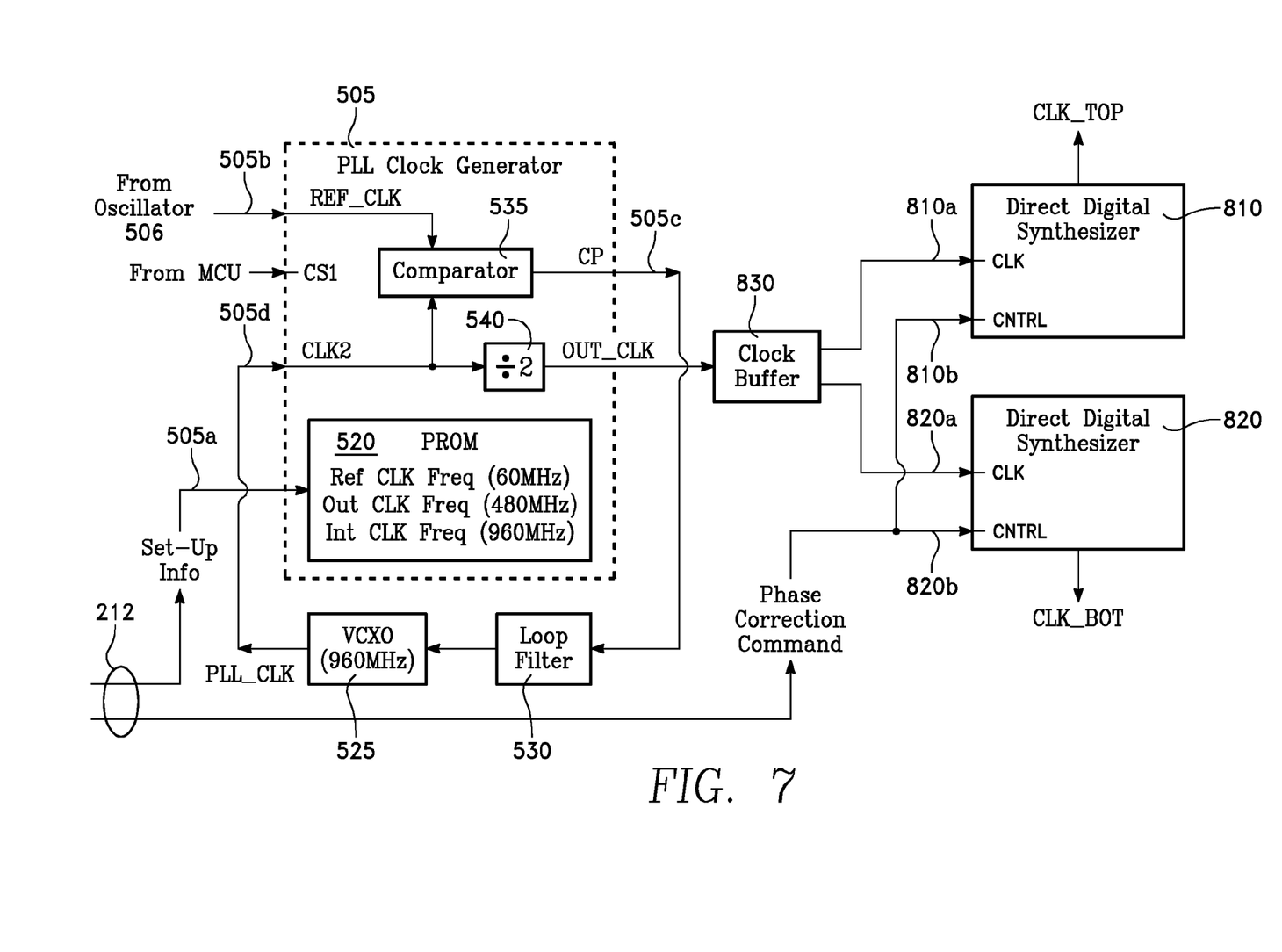
FIG. 7 is a schematic block diagram of a system in accordance with a second embodiment.

The DDS 510 of FIGS. 1A-3 is a dual output DDS which produces two clock signals with a controlled phase difference between them, as described above. In another embodiment illustrated in FIG. 7, the dual output DDS 510 is replaced by a pair of single output direct digital synthesizers, namely a single output DDS 810 and a single output DDS 820. The DDS 810 produces the clock signal CLK_TOP and the DDS 810 produces the clock signal CLK_BOT. Each DDS 810, 820 receives at its clock input a signal derived from the output clock signal OUT_CLK produced by the PLL clock generator 505 and described above. An optional clock buffer 830 may enable connection to the clock inputs 810a, 820a of the DDSs 810, 820. The output of the MCU 210 through the information channel 212 is coupled to the control inputs 810b, 820b of the DDS's 810, 820. In this embodiment, the MCU 210 may be programmed to send the phase correction control signal to either one of the two DDS's 810, 820. Alternatively, the MCU 210 may be programmed to send each DDS 810, 820 a different command signal on the information channel 212, each command signal representing a respective portion of the desired phase correction, the sum of the two portions constituting the desired phase correction. For example, if the phase correction determined by the MCU 210 is a certain phase correction angle, then the two command signals may represent opposing changes of one half the magnitude of the phase correction angle. An advantage of the embodiment of FIG. 7 is that the output clock signal OUT_CLK sent to each single output DDS 810, 820 may be a much higher frequency, e.g., twice that of OUT_CLK in the embodiment of FIGS. 1A-3. This provides higher resolution phase correction.

Figure 8:
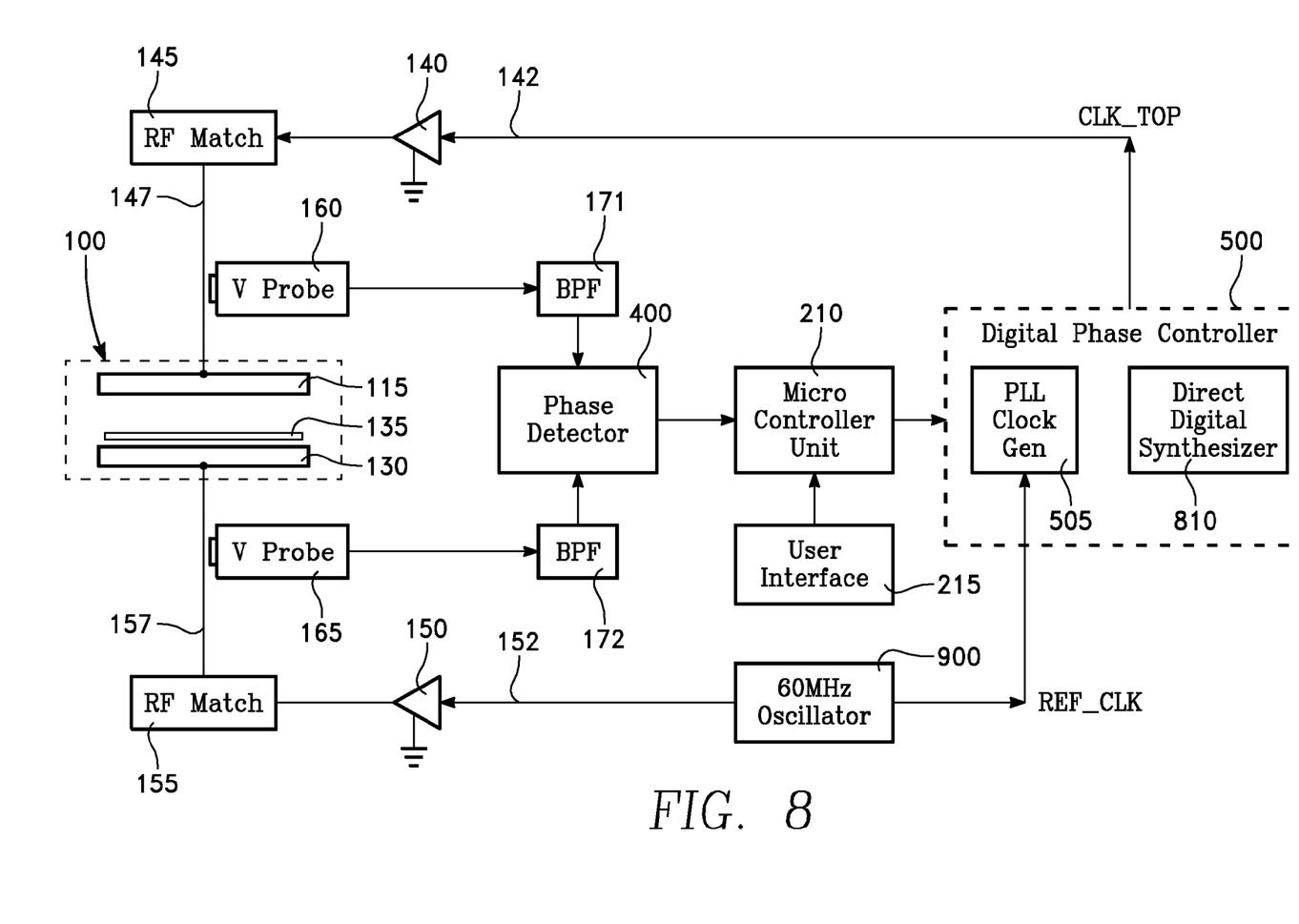
FIG. 8 is a schematic block diagram of a system in accordance with a third embodiment.
Figure 9:
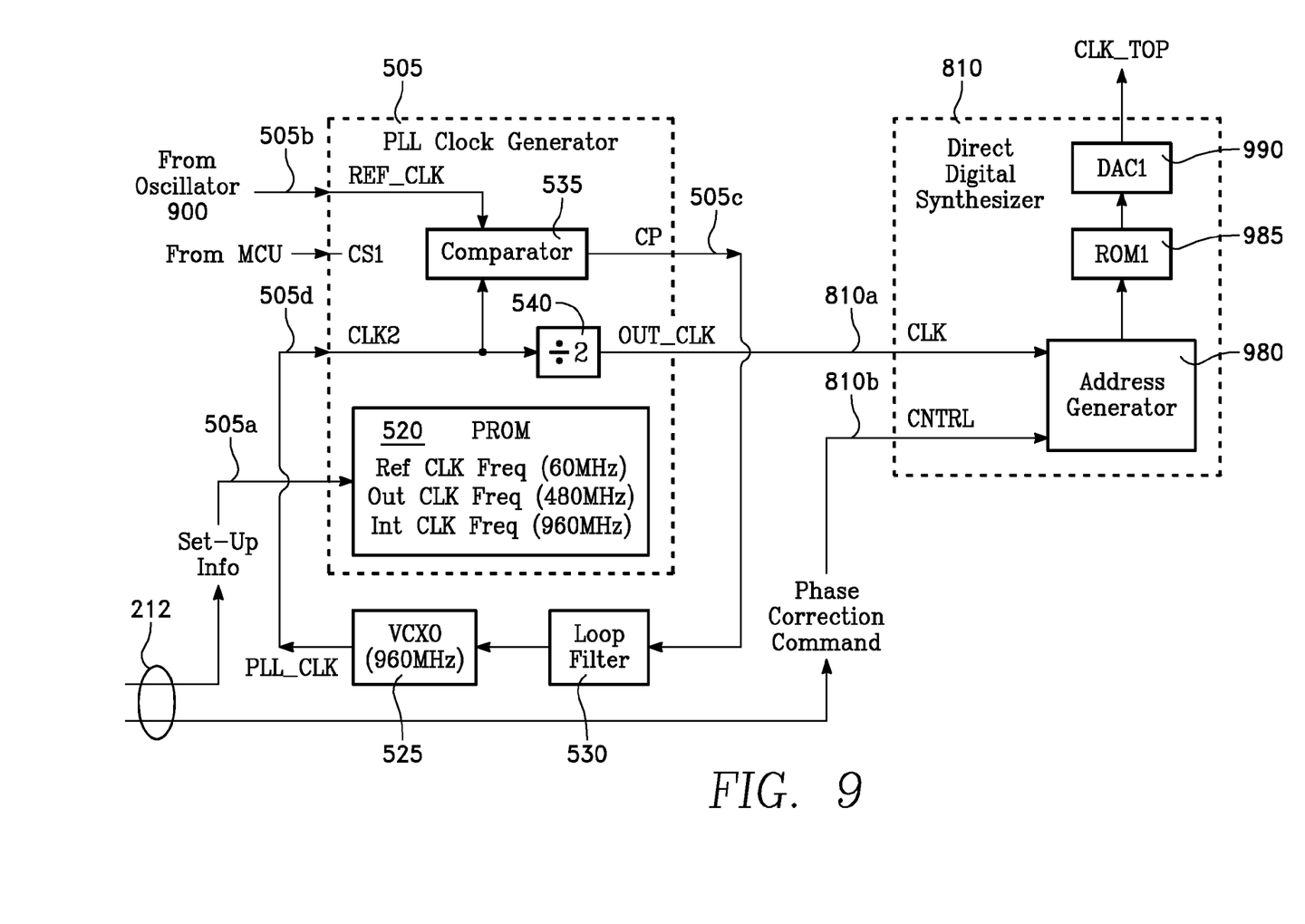
FIG. 9 is a schematic block diagram depicting the architecture of a digital phase controller in the embodiment of FIG. 8.

FIG. 8 depicts an embodiment in which the phase controller of FIG. 7 is modified to function as a phase shifter and provides only one of the two clock signals CLK_TOP, CLK_BOT. In the example of FIG. 8, only CLK_TOP is provided. The embodiment FIG. 8 employs only one of the two single output DDS's 810, 820, and in the illustrated example it is the DDS 810. The bottom RF amplifier 150 is controlled by the output of a crystal controlled oscillator 900 at the clock input 152 of the bottom RF amplifier 150. The clock signal from the crystal controlled oscillator 900, REF_CLK, is provided to both the RF amplifier input 152 and the PLL clock generator 505. FIG. 9 is a schematic block diagram depicting the digital phase controller 500 of FIG. 8. As shown in FIG. 9, the digital phase controller 500 of FIG. 8 employs only the single output DDS 810 and generates only the clock signal CLK_TOP. In the embodiment of FIG. 9, the DDS 810 includes an address generator 980 connected at a clock input 810a to the OUT_CLK signal from the PLL clock generator 505. The address generator 980 is further connected to receive at a control input 810b the phase correction command signal from the MCU 210 via the multi-signal information channel 212. The address generator 980 has an output connected to the address input of a read-only memory (ROM) 985, whose output is processed by a digital-to-analog converter 990. The address generator 980 and ROM 985 operate in a manner similar to the manner of operation of the address generator 560 and ROM 562 of FIG. 3, to produce the clock signal CLK_TOP whose phase is adjusted in response to the phase correction command signal at the control input 810b.

Figure 10:
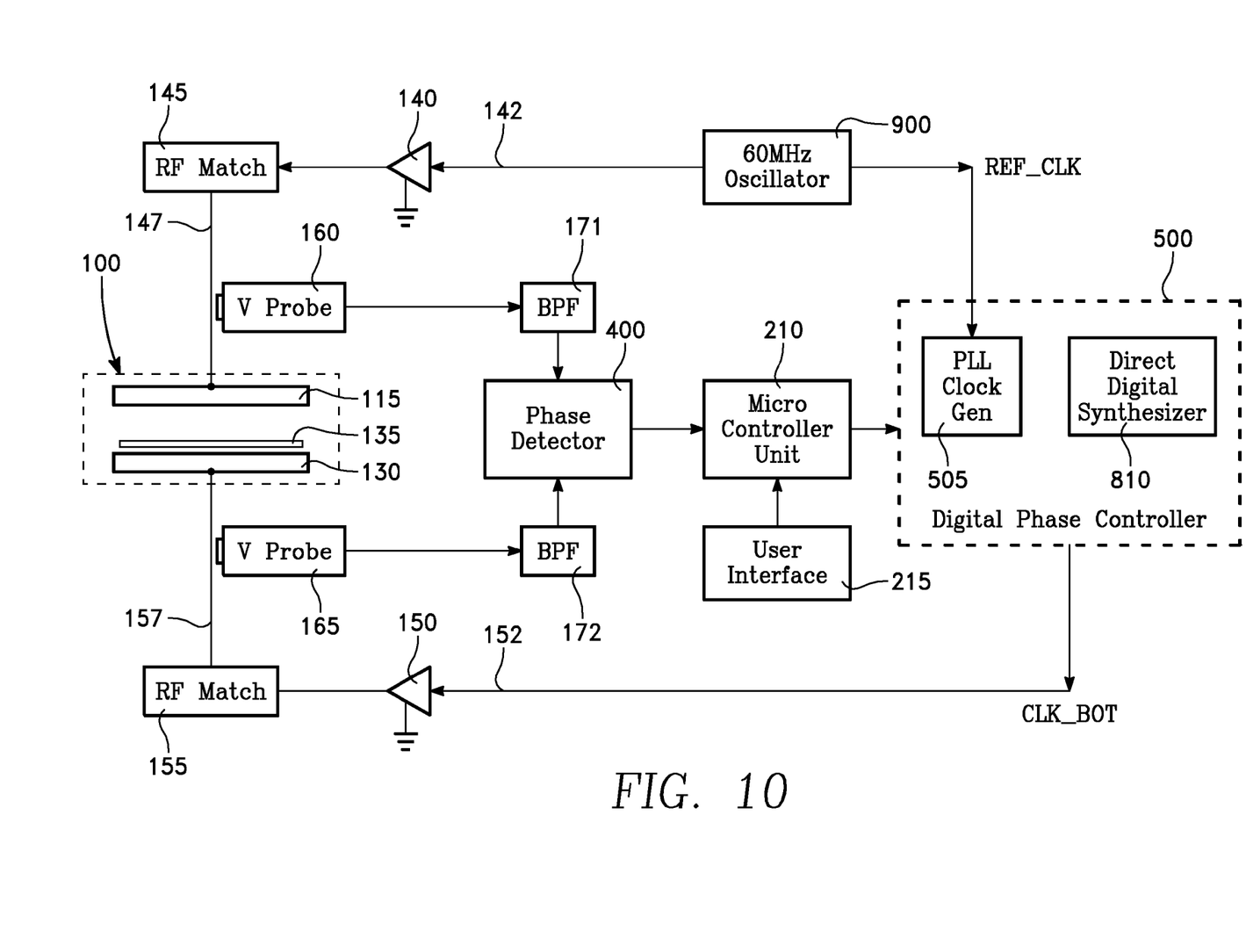
FIG. 10 is a schematic block diagram of a modification of the embodiment of FIG. 8.

The arrangement of FIG. 8 may be reversed as depicted in FIG. 10, in which the crystal oscillator 900 drives the top amplifier 140. In embodiment of FIG. 10, the digital phase controller 500, using the single output DDS 810, generates only the clock signal CLK_BOT to drive the bottom amplifier 150, using the single output DDS 820.

In a working implementation of the embodiment of FIGS. 2 and 3, the phase detector 400 was implemented as a field programmable gate array providing a digital output, the PLL clock generator 505 was an integrated circuit AD9510 and the dual output DDS 510 was an integrated circuit AD9958. In a working implementation of the embodiment of FIG. 7, each single output DDS 810 and 820 was an integrated circuit AD9910. A working implementation of the embodiment of FIG. 8 employed the integrated circuit AD9958 as the DDS. Any other suitable choice of integrated circuits may be employed to implement the embodiments described above.

While the foregoing is directed to embodiments of the present invention, other and further embodiments of the invention may be devised without departing from the basic scope thereof, and the scope thereof is determined by the claims that follow.

What is claimed is:

1. A plasma reactor for processing a workpiece, comprising:
   a pair of electrodes coupled to a pair of RF power amplifiers having an RF phase angle between them;
   a feedback controller having a phase correction signal output dependent upon said RF phase angle and a user-defined target phase angle;
   a clock generator comprising: (a) an oscillator responsive to a control signal corresponding to a phase difference between said oscillator and a reference clock, and (b) an output clock derived from an output of said oscillator;
   an address generator comprising a pair of address outputs incremented in synchronism with said output clock and separated by an address difference dependent upon said phase correction signal output;
   a pair of waveform-containing read only memories coupled to receive respective ones of said pair of address outputs, and coupled to respective ones of said RF power amplifiers.

2. The plasma reactor of claim 1 further comprising a microcontroller coupled to said clock generator, said microcontroller adapted to prevent change in said control signal after a limited initialization period.

3. The plasma reactor of claim 2 wherein said microcontroller is coupled to said address generator, said microcontroller further adapted to inactivate said address generator during said limited initialization period.

4. The plasma reactor of claim 2 wherein said feedback controller is comprised in said microcontroller.

5. The plasma reactor of claim 1 wherein said output clock is of a frequency exceeding said reference clock by a first integer multiple, and said oscillator has a frequency exceeding said frequency of said output clock by a second integer multiple.

6. The plasma reactor of claim 5 wherein said first integer multiple is 8 or greater and said second integer multiple is 2 or greater.

7. The plasma reactor of claim 1 wherein said reference clock is on the order of about 60 MHz, said output of said oscillator has a frequency on the order of about 960 MHz, and said output clock is on the order of about 480 MHz.

8. The plasma reactor of claim 1 wherein said phase correction signal output is a function of said RF phase angle and a user-defined target phase angle, and wherein said function comprises a ratio between a frequency of said reference clock and a frequency of said output clock.

9. A plasma reactor for processing a workpiece, comprising:
   a pair of electrodes facing a processing zone and a pair of RF power amplifiers coupled to respective ones of said electrodes, there being an RF phase angle between said pair of electrodes;
   a feedback controller having a phase correction signal output that is a function of said RF phase angle and a user-defined target phase angle;
   a clock generator comprising: (a) an oscillator responsive to a control signal corresponding to a phase difference between said oscillator and a reference clock, and (b) an output clock derived from an output of said oscillator, said control signal being unchanging following a limited initialization period;
   an address generator comprising a pair of address outputs incremented in synchronism with said output clock and separated by an address difference that is a function of said phase correction signal output;
   a pair of waveform-containing read only memories coupled to receive respective ones of said pair of address outputs, and coupled to respective ones of said RF power amplifiers.

10. The plasma reactor of claim 9 wherein said address generator is inactive during said limited initialization period.

11. The plasma reactor of claim 9 wherein said function of said phase correction signal comprises a ratio between a frequency of said reference clock and a frequency of said output clock.

12. The plasma reactor of claim 9 wherein said output clock is of a frequency exceeding said reference clock by a first integer multiple, and said oscillator has a frequency exceeding said frequency of said output clock by a second integer multiple.

13. The plasma reactor of claim 12 wherein said first integer multiple is 8 or greater and said second integer multiple is 2 or greater.

14. The plasma reactor of claim 9 wherein said reference clock is on the order of about 60 MHz, said output of said oscillator has a frequency on the order of about 960 MHz, and said output clock is on the order of about 480 MHz.

15. The plasma reactor of claim 9 wherein said address generator comprises a pair of address generators having respective outputs coupled to respective ones of said pair of read only memories.

16. A plasma reactor for processing a workpiece, comprising:
   a pair of electrodes facing a processing zone and a pair of RF power amplifiers coupled to respective ones of said electrodes and having an RF phase angle between said pair of electrodes, and an oscillator providing a reference clock directly to one of said pair of RF power amplifiers;
   a feedback controller having a phase correction signal output that is a function of said RF phase angle and a user-defined target phase angle;
   a clock generator comprising: (a) an oscillator responsive to a control signal corresponding to a phase difference between said oscillator and a reference clock, and (b) an output clock derived from an output of said oscillator;
   an address generator comprising an address output incremented in synchronism with said output clock and having an address that is a function of said phase correction signal output;
   a waveform-containing read only memory coupled to receive said address outputs, and coupled to respective ones of said RF power amplifiers.

17. The plasma reactor of claim 16 further comprising a microcontroller coupled to said clock generator, said microcontroller adapted to prevent change in said control signal after a limited initialization period.

18. The plasma reactor of claim 17 wherein said microcontroller is coupled to said address generator, said microcontroller further adapted to inactivate said address generator during said limited initialization period.

19. The plasma reactor of claim 17 wherein said feedback controller is comprised in said microcontroller.

20. The plasma reactor of claim 16 wherein said output clock is of a frequency exceeding said reference clock by a first integer multiple, and said oscillator has a frequency exceeding said frequency of said output clock by a second integer multiple.

* * * * *